United States Patent [19]

Huijsing et al.

[11] Patent Number: 5,485,121
[45] Date of Patent: Jan. 16, 1996

[54] AMPLIFIER ARRANGEMENT WITH MULTIPATH MILLER ZERO CANCELLATION

[75] Inventors: Johan H. Huijsing, Schipluiden; Rudolphe G. H. Eschauzier, Spijkenisse, both of Netherlands

[73] Assignee: U.S. Philips Corporation, New York, N.Y.

[21] Appl. No.: 263,110

[22] Filed: Jun. 21, 1994

[30] Foreign Application Priority Data

Jun. 21, 1993 [EP] European Pat. Off. ............. 93201779

[51] Int. Cl.$^6$ ........................................... H03F 1/14
[52] U.S. Cl. ............................................ 330/260; 330/292
[58] Field of Search ..................... 330/107, 109, 330/151, 260, 292, 294

[56] References Cited

U.S. PATENT DOCUMENTS

| | | | |
|---|---|---|---|
| 4,354,162 | 10/1982 | Wright | 330/260 |
| 4,502,017 | 2/1985 | Van de Plassche et al. | 330/151 |
| 5,155,447 | 10/1992 | Huijsing et al. | 330/107 |

OTHER PUBLICATIONS

P. R. Gray & R. G. Meyer, "MOS Operational Amplifier Design—A Tutorial Overview", IEEE Journal of Solid-State Circuits, vol. SC-17, No. 6, Dec. '92, pp. 969–982.

B. K. Ahuja, "An Improved Frequency Compensation Technique for CMOS Operational Amplifiers", IEEE Journal of Solid–State Circuits, vol. sc–18, No. 6, Dec. '83, pp. 629–633.

*Primary Examiner*—Steven Mottola
*Attorney, Agent, or Firm*—Laurie E. Gathman

[57] ABSTRACT

An amplifier arrangement comprises an inverting transconductance stage having an input and an output; a capacitor coupled between the input and the output of the inverting transconductance stage; and signal current means having a first output coupled to the input of the inverting transconductance stage to provide a first signal current to the input of the inverting transconductance stage. The signal current means further comprises a second output coupled to the output of the inverting transconductance stage to provide a second signal current to the output of the inverting transconductance stage, which second signal current is substantially equal and in phase opposition to the first signal current. A second parallel path bypasses the Miller-compensated transconductance stage to eliminate the right half-plane zero of the Miller compensation.

4 Claims, 3 Drawing Sheets

AMPLIFIER ARRANGEMENT WITH MULTIPATH MILLER ZERO CANCELLATION

BACKGROUND OF THE INVENTION

The invention relates to an amplifier arrangement comprising an inverting transconductance stage having an input and an output; a capacitor coupled between the input and the output of the inverting transconductance stage; and signal current means having a first output coupled to the input of the inverting transconductance stage to provide a first signal current to the input of the inverting transconductance stage.

Such an amplifier arrangement is known, for example, from a paper by P. R. Gray et al., "MOS Operational Amplifier Design—A Tutorial Overview", IEEE Journal of Solid State Circuits, Vol. SC-17, No. 6, Dec. 1982, pp. 969–982. A very well known and widespread frequency-compensation method for amplifiers is Miller compensation or pole splitting, as shown in FIG. 1. Placing a Miller capacitor 2 between the input 4 and the output 6 of an inverting transconductance stage 8 splits the input and output poles caused by the capacitances 10 and 12 at the input 4 and the output 6, resulting in a well-controlled 20 dB/decade frequency roll-off. The transconductance stage 8 is driven by a signal source 14 having an output 16 coupled to the input 4 to supply a signal current $I_{in}$ to the transconductance stage. FIG. 2 shows a simple Miller-compensated amplifier in which the inverting transconductance stage 8 is formed by a transistor M1 and the signal source 14 by a differential transistor pair M2–M3. A disadvantage of the Miller technique is the zero appearing in the right-half of the s-plane of the complex transfer function of the amplifier arrangement. This Right Half-Plane (RHP) zero severely degrades the phase margin of the amplifier. The zero is caused by the direct path the Miller capacitor 2 creates from the input 4 to the output 6. Signal current taking this path is in phase opposition to the output current of the inverting transconductance stage 8. It can easily be understood that this opposite phase current reduces the bandwidth in a feedback system because the sign of the feedback changes from negative to positive for high frequencies. The position of the RHP zero is $z=g_m/C_m$, where $g_m$ is the transconductance of the inverting transconductance stage 8 and $C_m$ the capacitance of the Miller capacitor 2. As the expression for the zero reveals, the influence of the RHP zero is inversely proportional to the transconductance $g_m$ of the inverting transconductance stage 8. Both bipolar and MOS circuits suffer from the effects of the RHP zero. Since MOS transistors normally have a lower transconductance than bipolar transistors MOS circuits are most strongly affected. In many cases the RHP zero determines the maximum bandwidth of a MOS amplifier. However, the RHP zero can also be a bandwidth limiting factor in bipolar designs.

In the past some measures to counteract the RHP zero have been proposed. A classic solution, also known from the afore-mentioned paper, is to insert a small resistor 16 in series with the Miller capacitor 2, as is shown in FIG. 3. Increasing the value $R_m$ of the resistor 16 shifts the RHP zero towards infinity. As the resistor value increases even more the zero will reappear in the Left Half-Plane. No zero will be present when $R_m=1/g_m$. As the optimum value $R_m$ of the compensation resistor 16 depends on the transconductance $g_m$ problems arise when the transconductance is not constant, for example, when the current through the transistor M1 has a large dynamic range. This is likely to occur in an output stage. In this situation the compensation can only be optimised for one value of the output current of the inverting transconductance stage, for example for the quiescent current. For all other output currents the compensation is suboptimal. Since the bandwidth of an amplifier depends on the worst-case position of the RHP zero not much bandwidth improvement can be expected from the compensation resistor 16.

Other propositions to eliminate the RHP zero are based on removing the direct path through the Miller capacitor 2. By inserting a unilateral element in the Miller capacitor branch direct feed-through is suppressed. FIG. 4 shows an implementation with a current buffer known from a paper by B. K. Ahuja, "An Improved Frequency Compensation Technique for CMOS Operational Amplifiers", IEEE Journal of Solid-State Circuits, Vol. SC-18, No. 6, Dec. 1983, pp. 629–633. A common gate transistor $M_m$ in series with a Miller capacitor 2 serves as the current buffer. A disadvantage of this approach is the addition of an active element, with its associated poles, in the Miller feedback path. These poles deteriorate the high frequency performance and the remedy is worse than the disease.

SUMMARY OF THE INVENTION

It is an object of the invention to provide a technique which eliminates the Right Half-Plane zero in Miller compensated amplifier arrangements but without the above problems. According to the present invention an amplifier arrangement as specified in the opening paragraph is characterized in that the signal current means further comprises a second output coupled to the output of the inverting transconductance stage to provide a second signal current to the output of the inverting transconductance stage, which second signal current is substantially in phase opposition to the first signal current.

A Multi-path Miller Zero Cancellation (MMZC) technique is proposed, which provides a parallel path to the output of the inverting transconductance stage, compensating for the current directly passing through the Miller capacitor. As a result of the parallel nature no additional poles are introduced. In addition, the operation of the MMZC is independent of the transconductance of the inverting transconductance stage. Optimum results may be obtained when the second signal current is substantially equal in magnitude to the first output current.

The MMZC technique can be used advantageously in a Multipath Nested Miller Integrator Structure known from U.S. Pat. No. 5,155,447, herewith incorporated by reference. For this purpose an embodiment of an amplifier arrangement according to the invention is further characterized in that the signal current means comprises a second transconductance stage having an input, a non-inverting output coupled to the input of the inverting transconductance stage, and an inverting output coupled to the output of the inverting transconductance stage, and in that the amplifier arrangement further comprises a second capacitor coupled between the output of the inverting transconductance stage and the input of the second transconductance stage; and a third transconductance stage having an input, a first non-inverting output coupled to the non-inverting output of the second transconductance stage, a second non-inverting output coupled to the input of the second transconductance stage, and an inverting output coupled to the output of the inverting transconductance stage.

BRIEF DESCRIPTION OF THE DRAWINGS

The above and other features and advantages of the invention will be apparent from the following description of exemplary embodiments of the invention with reference to the accompanying drawings, in which.

Throughout the drawings similar reference signs denote similar parts.

DETAILED DESCRIPTION OF THE PREFERRED EMBODIMENTS

Figure 1:
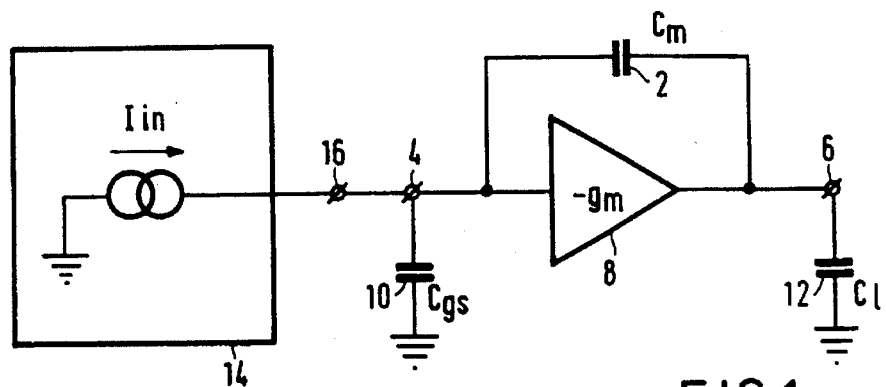
FIGS. 1 is a circuit diagram of a prior-art Miller-compensated amplifier arrangement.
Figure 2:
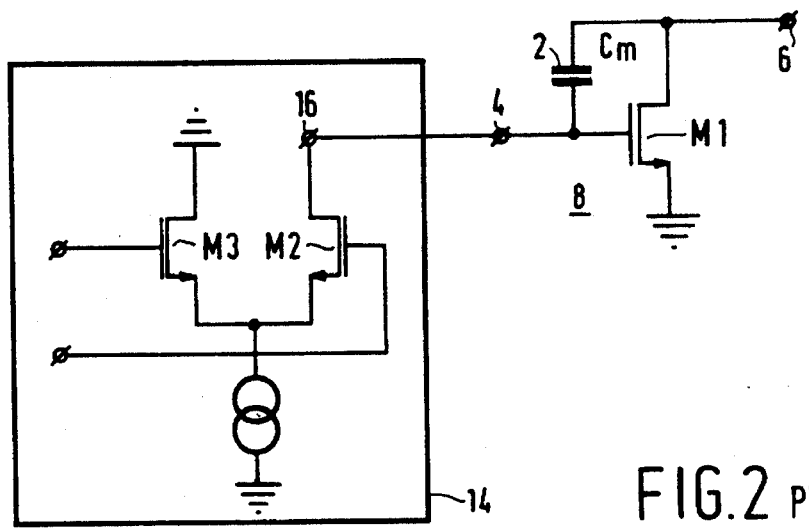
FIG. 2 is a circuit diagram of a prior art Miller-compensated amplifier arrangement.
Figure 3:
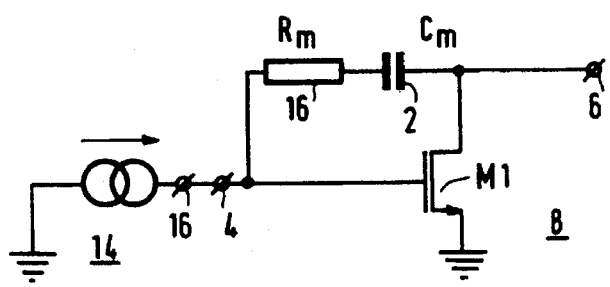
FIG. 3 is a circuit diagram of a prior art Miller-compensated amplifier arrangement.
Figure 4:
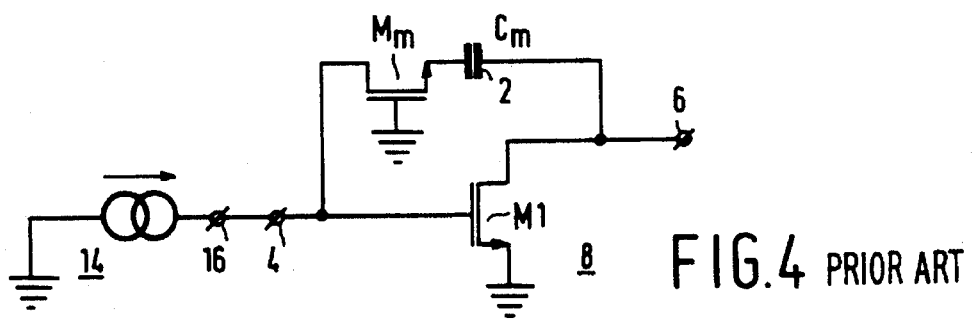
FIG. 4 is a circuit diagram of a prior art Miller-compensated amplifier arrangement.
Figure 5:
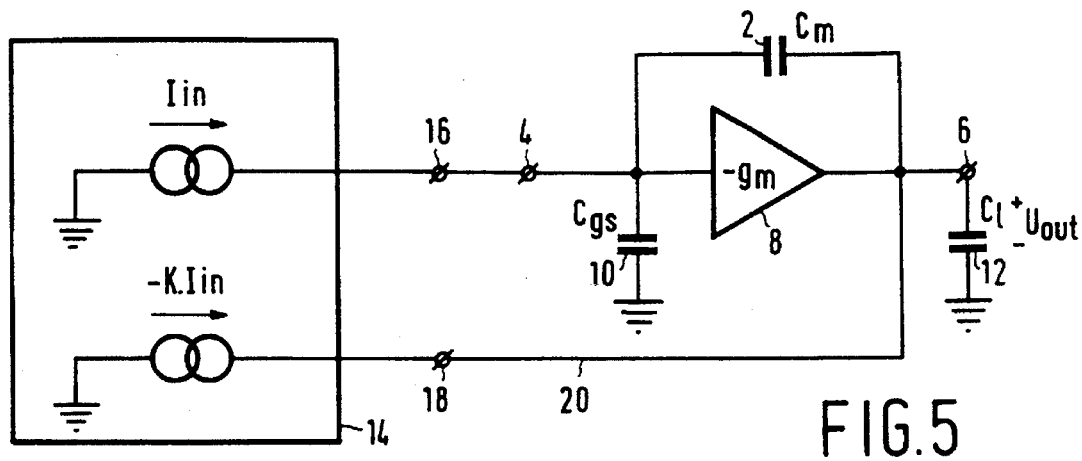
FIG. 5 is a basic circuit diagram of a Miller-compensated amplifier arrangement according to the invention.

FIG. 5 illustrates the principle of operation of the Multipath Miller Zero Cancellation (MMZC) technique. The circuit shown in FIG. 5 is basically the same as the circuit shown in FIG. 1. However, the signal current means 14 further include a second output 18, which is coupled to the output 6 of the inverting transconductance stage 8 and which provides a signal current $-k*I_{in}$ which is proportional and in phase opposition to the signal current $I_{in}$ of output 16. This provides a parallel path 20 which counteracts the current flowing through the Miller capacitor 2. The complex transfer function of the FIG. 5 circuit can be written as:

$$\frac{U_{out}}{I_{in}} = \frac{-g_m + sC_m - ks(C_m + C_{gs})}{s(s(C_lC_m + C_lC_{gs} + C_mC_{gs}) + C_mg_m)} \quad (1)$$

The constant k in equation (1) determines the extent to which the parallel path 20 is active. The absence of k in the denominator of equation (1) demonstrates that the parallel path 20 has no influence on the positions of the poles. Looking at the numerator, the effect of the parallel path 20 on the zero can be determined. Setting k=1 leads to the following zero position:

$$z = -\frac{g_m}{C_{gs}} \quad (2)$$

As equation (2) indicates, the zero changes place from the Right to the Left Half-Plane. In practical applications this zero will be outside the pass-band of the amplifier arrangement. Moreover, in the left half of the s-plane the zero improves rather than worsens the phase margin of the amplifier.

Figure 6:
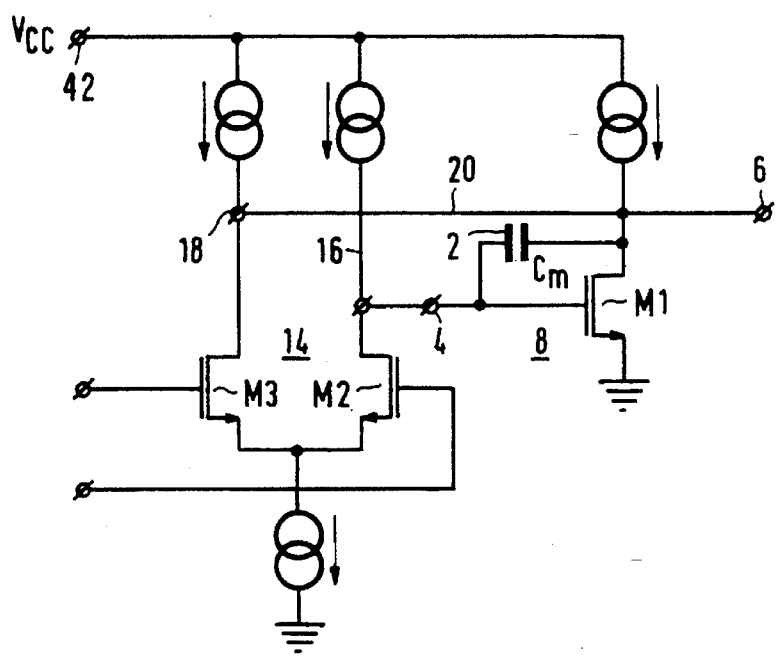
FIG. 6 is a circuit diagram of an embodiment of a Miller-compensated amplifier arrangement according to the invention.

FIG. 6 shows a preferred embodiment of the MMZC technique. The signal current means 14 comprises a differential transistor pair M2–M3 and the inverting transconductance stage 8 is a single transistor MI. The drain of the transistor M1 constitutes the output 6 of the inverting transconductance stage 8, the gate is the input 4 of the inverting transconductance stage 8, and the source is coupled to ground. The drains of the transistors M2 and M3 constitute the first and the second output 16 and 18 of the signal current means 14 and are coupled to the input 4 and the output 6, respectively. The drains of the transistors M1, M2 and M3 are coupled to a supply terminal 42 via respective bias current sources. The parallel path 20 is fed by the transistor M3. The current in the parallel path 20 and the drain current of transistor M2 have the same magnitude but are of opposite phase. Since most of the drain current of transistor M2 flows into the Miller capacitor 2 the current in the parallel path 20 compensates for this feed-through. The transistor M2, the transistor M3 and the Miller capacitor 2 form a closed loop, effectively isolating the input differential pair M2–M3 from the output 6.

Figure 7:
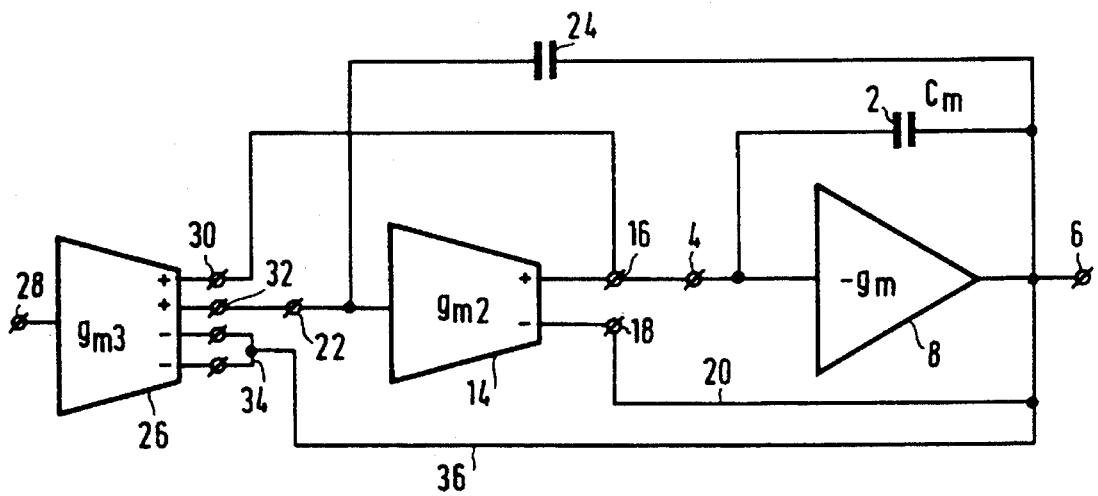
FIG. 7 is a block diagram of a known multipath nested Miller-integrated structure provided with a Miller-compensated amplifier arrangement according to the invention.

The MMZC technique can be used in the Multipath Nested Miller Structure known from U.S. Pat. No. 5,155,447. FIG. 7 shows a block diagram of such a structure, which is equivalent to the structure disclosed in FIG. 7 of said Patent. The signal current means 14 and the inverting transconductance stage 8 are coupled as shown in FIG. 5. The signal current means 14 has an input 22 to form a second transconductance stage with the inverting output 18 and the non-inverting output 16 in a fashion, for example, as shown in FIG. 6. A second Miller capacitor 24 is connected between the output 6 and an input 24 of the signal current means 14 to form a Nested Miller Structure. A third transconductance stage 26 has an input 28, first and second non-inverting outputs 30 and 32, which are coupled to the input 22 and the non-inverting output 16, respectively, of the second transconductance stage 14 in order to form the Multipath Nested Miller Structure as shown in FIG. 7 of said Patent, and an inverting output 34, which is coupled to the output 6 via a path 36 in order to also form a Multipath Miller Zero Cancellation structure according to this invention.

Figure 8:
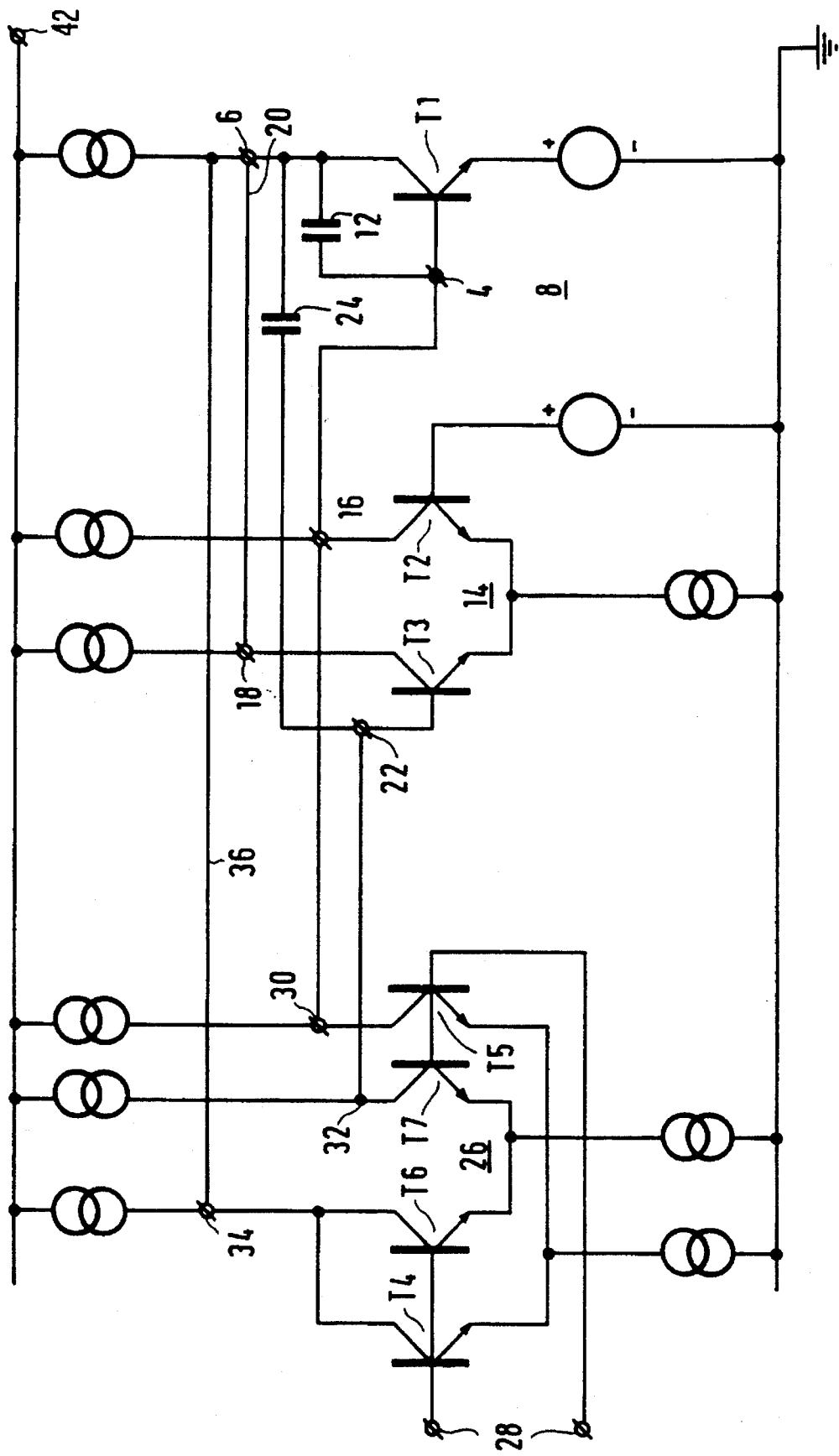
FIG. 8 is a circuit diagram of an implementation with bipolar transistors of the structure shown in FIG. 7.

FIG. 8 shows an implementation of the structure shown in FIG. 7, using bipolar transistors. The inverting transconductance stage 8 and the second transconductance stage 14 are basically as shown in FIG. 6. The base of the transistor T2 of the second transconductance stage 14 and the emitter of the transistor T1 of the first transconductance stage 8 are connected to ground via suitable bias voltage sources. The third transconductance stage 26 is a double differential pair T4/T5 and T6/T7 with common input terminals 28. The emitters of pair T4/T5 and the emitters of pair T6/T7 are coupled to ground via separate bias current sources. In an alternative embodiment both pairs may be coupled to ground via a common bias current source. Other alternative embodiments can be found in the said Patent. The second, the third and the fourth transconductance stage shown therein should be extended with inverting outputs equal in number to the number of non-inverting outputs already present, which inverting outputs are to be coupled to the output 6 as shown in FIG. 7.

From the above it will be obvious to those having ordinary skill in the art that many changes and variations may be made based on the above-described invention without departing from the underlying principles thereof.

What is claimed is:

1. An amplifier arrangement comprising:

an inverting transconductance stage having an input and an output;

a capacitor coupled between the input and the output of the inverting transconductance stage;

and signal current means having a first output coupled to the input of the inverting transconductance stage to provide a first signal current to the input of the inverting transconductance stage, characterized in that the signal current means further comprises a second output coupled to the output of the inverting transconductance stage to provide a second signal current to the output of the inverting transconductance stage, which second signal current is substantially in phase opposition to the first signal current.

2. An amplifier arrangement as claimed in claim 1, characterized in that the second signal current is substantially equal in magnitude to the first signal current.

3. An amplifier arrangement as claimed in claim 1, characterized in that the signal current means comprises a second transconductance stage having an input, a non-inverting output coupled to the input of the inverting transconductance stage, and an inverting output coupled to the output of the inverting transconductance stage (8).

4. An amplifier arrangement as claimed in claim 3, characterized in that the amplifier arrangement further comprises a second capacitor (24) coupled between the output (6) of the inverting transconductance stage (6) and the input (22) of the second transconductance stage (14); and a third transconductance stage (26) having an input (28), a first non-inverting output (30) coupled to the non-inverting output (16) of the second transconductance stage (14), a second non-inverting output (32) coupled to the input (22) of the second transconductance stage (14) and an inverting output (34) coupled to the output (6) of the inverting transconductance stage (8).

* * * * *